United States Patent
Luo

(10) Patent No.: US 12,349,346 B2
(45) Date of Patent: Jul. 1, 2025

(54) DIVIDER AND CONTACT FORMATION FOR MEMORY CELLS

(71) Applicant: Micron Technology, Inc., Boise, ID (US)

(72) Inventor: Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 499 days.

(21) Appl. No.: 17/732,286

(22) Filed: Apr. 28, 2022

(65) Prior Publication Data
US 2023/0354601 A1    Nov. 2, 2023

(51) Int. Cl.
*H10B 43/10*    (2023.01)

(52) U.S. Cl.
CPC .................... *H10B 43/10* (2023.02)

(58) Field of Classification Search
CPC .................. H10B 43/10; H10B 43/27
See application file for complete search history.

(56) References Cited

U.S. PATENT DOCUMENTS

| 2016/0071876 A1* | 3/2016 | Mizuno | H10B 43/40 438/269 |
| 2020/0388688 A1* | 12/2020 | Baraskar | H01L 23/5226 |

\* cited by examiner

*Primary Examiner* — Timor Karimy
(74) *Attorney, Agent, or Firm* — Holland & Hart LLP

(57) ABSTRACT

Methods, systems, and devices for divider and contact formation for memory cells are described. In some examples, a protective mask (e.g., a photoresist layer) may be formed over existing circuit structures above a substrate. Contact structures may be exposed when the protective mask is removed. In some examples, the protective mask may be removed using a dry etching operation. In some examples, one or more additional etching operations may be performed to expose (and subsequently fabricate) additional circuit structures.

10 Claims, 13 Drawing Sheets

SECTION A-A

SECTION A-A

SECTION A-A

DIVIDER AND CONTACT FORMATION FOR MEMORY CELLS

FIELD OF TECHNOLOGY

The following relates to one or more systems for memory, including divider and contact formation for memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

In some semiconductor manufacturing operations, a circuit is formed above a substrate. For example, structures (e.g., channels, contacts) may be formed above a substrate or between layers of a dielectric material and features of a memory array, such as access lines or memory cells (e.g., of different levels of the memory array), may be formed therein (e.g., access lines may be formed within the contacts). In some examples, one or more dividers may be formed within the dielectric material to separate (e.g., divide) the circuit into different portions (e.g., blocks).

In some memory applications, material may be deposited over the top of the dividers and contacts to prevent exposure during other manufacturing operations. For example, a protective mask may be formed over the top layer of circuit structures to prevent some components from being exposed during an etching operation (e.g., a wet etch operation). However, in some examples, a wet etch operation may inadvertently remove material in an undesired location and thus expose the structures that the protective mask intended to protect. This result, referred to as "undercutting" herein, may expose both the contacts and the dividers during subsequent etching operations. Moreover, the undercutting may lead to poor tolerances or performance (e.g., undercutting of the protective mask may lead to inadvertent removal of sacrificial material during subsequent wet etches, causing component failures), or failure to implement circuit structures of a semiconductor device, among other issues. Thus it may be desirable to manufacture a circuit with reduced undercutting.

Memory devices and methods to manufacture such memory devices with reduced undercutting are described herein. For example, methods for fabricating semiconductor devices may include one or more etching operations that prevent damage to circuit structures and thus improve subsequent processing outcomes. In some examples, a protective mask (e.g., a photoresist material) may be formed over existing circuit structures (e.g., dividers, contacts) above the substrate. Contact structures may then be exposed when the photoresist material is removed (e.g., in a selective etching operation). In some examples, the selective etching operation may include a dry etch to remove the photoresist material from each contact. In some examples, one or more additional selective etching procedures may be performed to fabricate additional circuit. By utilizing dry etching operations to remove materials above the substrate, undercutting of the protective mask may be prevented or mitigated, which may preserve some structures of the circuit while other structures are formed. Accordingly, such methods may mitigate poor tolerances or performance that would otherwise occur due to the occurrence of undercutting.

Figure 1:
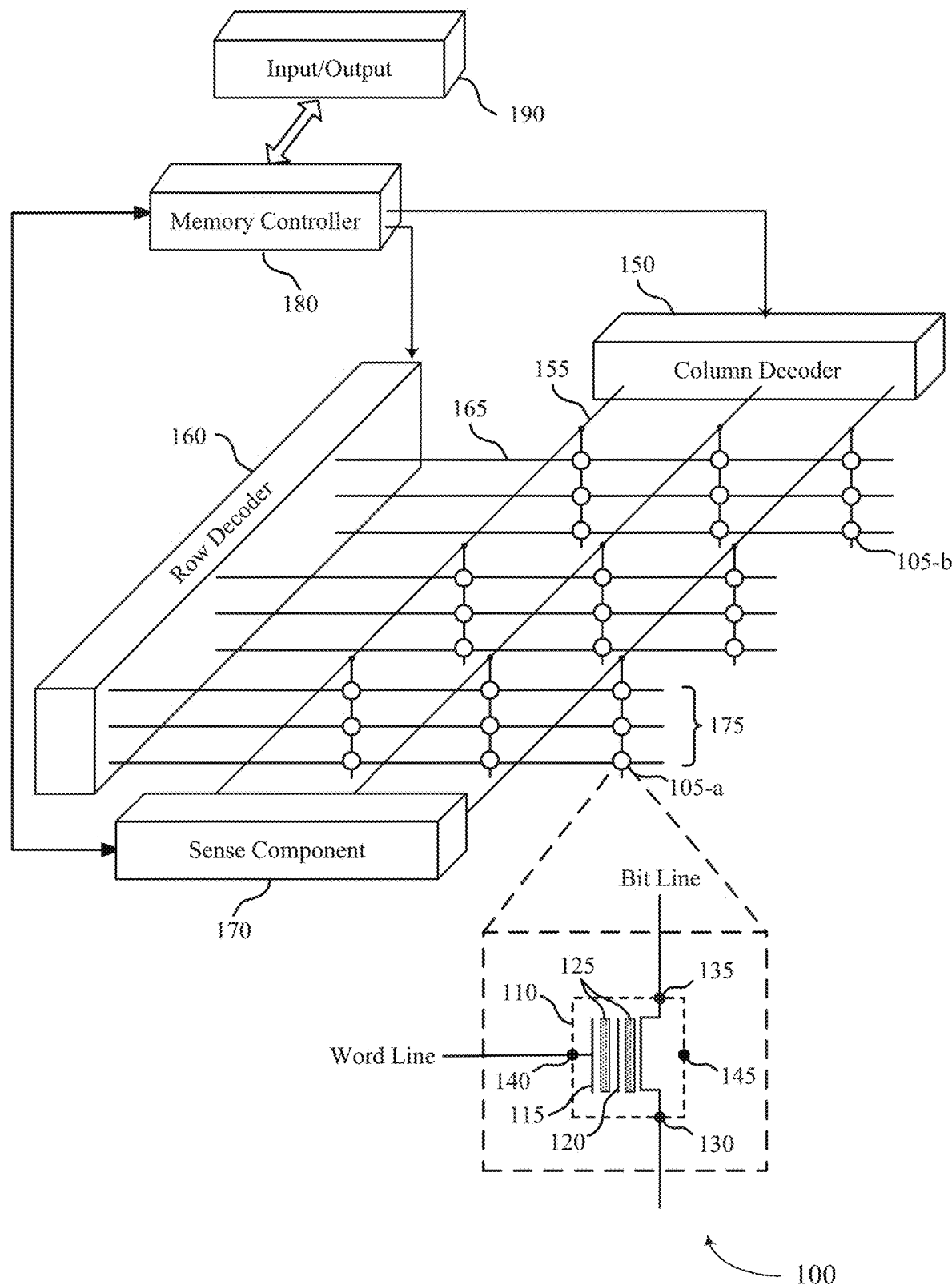
FIG. 1 illustrates an example of a system that supports divider and contact formation for memory cells in accordance with examples as disclosed herein.
Figure 2:
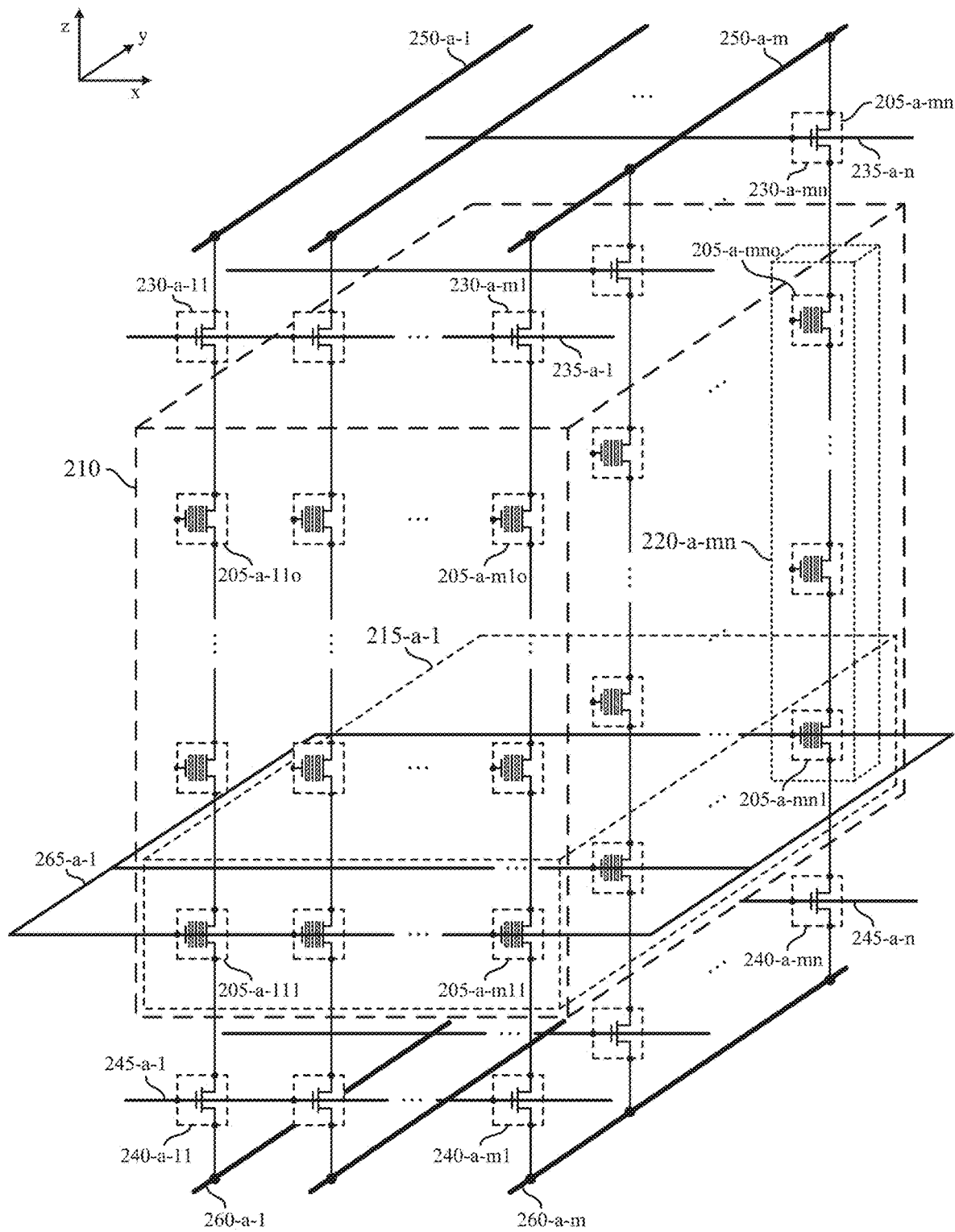
FIG. 2 illustrates an example of a memory architecture that supports divider and contact formation for memory cells in accordance with examples as disclosed herein.

Features of the disclosure are initially described in the context of systems, devices, and circuits with reference to FIGS. 1 and 2. Features of the disclosure are described in the context of a memory architecture and manufacturing operations with reference to FIGS. 3 through 12. These and other features of the disclosure are further illustrated by and described in the context of a flowchart that relates to divider and contact formation for memory cells with reference to FIG. 13.

FIG. 1 illustrates an example of a memory device 100 that supports divider and contact formation for memory cells in accordance with examples as disclosed herein. FIG. 1 is an illustrative representation of various components and features of the memory device 100. As such, the components and features of the memory device 100 are shown to illustrate functional interrelationships, and may not show precise physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. A substrate may refer to a base layer of material (e.g., silicon, polysilicon, metal, etc.) on which the memory device 100 is formed. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some techniques for manufacturing a memory device 100 (e.g., for manufacturing one or more aspects of the memory device 100), a circuit may be formed above a substrate. For example, in some memory applications, structures (e.g., channels, contacts) may be formed above the substrate or between layers of a dielectric material and access lines or memory cells 105 may be formed from materials deposited between the layers of the dielectric material (e.g., access lines may be formed within the contacts). One or more dividers may be formed within the dielectric material to separate the memory die into different portions.

Aspects of the memory device 100 may be fabricated such that reduced undercutting occurs. For example, methods for fabricating aspects of the memory device 100 may include performing one or more etching operations that prevent damage to circuit structures and thus improve subsequent processing outcomes. In some examples, a protective mask (e.g., a photoresist material) may be formed over existing circuit structures (e.g., dividers, contacts) above the substrate. Contact structures may then be exposed when the photoresist material is removed (e.g., in a selective etching operation). In some examples, the selective etching operation may include a dry etching operation to remove the photoresist material from each contact. For example, upon removing the photoresist material from each contact, the contacts may be filled with a metal such that access lines (e.g., bit lines 155 or word lines 165) may be formed therein.

In some examples, one or more additional selective etching procedures may be performed to fabricate additional aspects of the circuit. By utilizing dry etching operations to remove materials above the substrate, undercutting may be prevented or mitigated, which may preserve some structures of the circuit while other structures are formed. Accordingly, such methods may mitigate poor tolerances or performance that would otherwise occur due to the occurrence of undercutting.

FIG. 2 illustrates an example of a memory architecture 200 that supports divider and contact formation for memory cells in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-a-ijk). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-a-1 associated with memory cells 205-a-111 through 205-a-mn1. In some examples, each page 215 may be associated with a same word line 265, (e.g., a word line 165 described with reference to FIG. 1), which may be coupled with a control gate 115 of each of the memory cells 205 of the page 215. For example, page 215-a-l may be associated with a word line 265-a-1, and other pages 215-a-i may be associated with a different respective word line 265-a-i (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-a-mn associated with memory cells 205-a-mn1 through 205-a-mno. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from at the granularity of a page 215, but may not be erasable (e.g., reset to a logic 1 value) at the granularity of a page 215. For example, NAND memory may instead be erasable at a higher level of granularity, such as at the level of granularity the block 210. In some cases, a memory cell 205 may be erased before it may be re-programmed. Different memory devices may have different read, write, or erase characteristics.

In some examples, each string 220 of the block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistors 230. Although illustrated as separate lines along the x-direction, in some examples, select lines 235 may be common to the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistors 240. Although illustrated as separate lines along the x-direction, in some examples, select lines 245 also may be common to the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. Concurrently, voltages may be applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 may be electrically connected to the corresponding bit line 250 and the source line 260. A channel may be an electrical path through the memory cells 205 in the string 220 (e.g., through the sources and drains of the transistors in the memory cells 205 of the string 220) that may conduct current under some operating conditions.

Concurrently, multiple word lines 265 (e.g., in some cases all word lines 265) of the block 210—except a word line 265 associated with a page 215 of the memory cell 205 to be read—may be set to a voltage (e.g., VREAD) that is higher than the threshold voltage (VT) of the memory cells 205. VREAD may cause the memory cells 205 in the unselected pages 215 to be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1) and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

In some techniques for manufacturing the memory architecture 200 (e.g., for manufacturing one or more aspects of the memory architecture 200), a circuit may be formed above a substrate. For example, in some memory applications, structures (e.g., channels, contacts) may be formed above the substrate or between layers of a dielectric material and access lines or memory cells 205 may be formed from materials deposited between the layers of the dielectric material (e.g., access lines may be formed within the contacts). One or more dividers may be formed within the dielectric material to separate the memory die into different portions.

Aspects of the memory architecture 200 may be fabricated such that reduced undercutting occurs. For example, methods for fabricating aspects of the memory architecture 200 may include performing one or more etching operations that prevent damage to circuit structures and thus improve subsequent processing outcomes. In some examples, a protective mask (e.g., a photoresist material) may be formed over existing circuit structures (e.g., dividers, contacts)

above the substrate. Contact structures may then be exposed when the photoresist material is removed (e.g., in a selective etching operation). In some examples, the selective etching operation may include a dry etching operation to remove the photoresist material from each contact. For example, upon removing the photoresist material from each contact, the contacts may be filled with a metal such that access lines (e.g., bit lines 250 or word lines 265) may be formed therein.

In some examples, one or more additional selective etching procedures may be performed to fabricate additional aspects of the circuit. By utilizing dry etching operations to remove materials above the substrate, undercutting may be prevented or mitigated, which may preserve some structures of the circuit while other structures are formed. Accordingly, such methods may mitigate poor tolerances or performance that would otherwise occur due to the occurrence of undercutting.

FIGS. 3 through 12 illustrate examples of fabrication operations that may support divider and contact formation for memory cells in accordance with examples as disclosed herein. For example, FIGS. 3 through 12 may illustrate aspects of a sequence of operations for fabricating aspects of a material arrangement 300, which may result in the formation of one or more aspects of the memory device 100 or the memory architecture 200 as described with reference to FIGS. 1 and 2, respectively. Each of FIGS. 3 through 12 may illustrate aspects of the material arrangement 300 after various processing steps. Each view of the view of the figures may be described with reference to an x-direction, a y-direction, and a z-direction as illustrated, which may correspond to the respective directions described with reference to the memory architecture 200.

Some of the provided figures include section views that illustrate example cross-sections of the material arrangement 300. For example, in FIGS. 3 through 12, a view "SECTION A-A" may be associated with a cross-section in an xy-plane (e.g., in accordance with a cut plane A-A) through a portion of the material arrangement 300. Although the material arrangement 300 illustrates examples of relative dimensions and quantities of various features, aspects of the material arrangement 300 may be implemented with other relative dimensions or quantities of such features in accordance with examples as disclosed herein.

Operations illustrated in and described with reference to FIGS. 3 through 12 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 3:
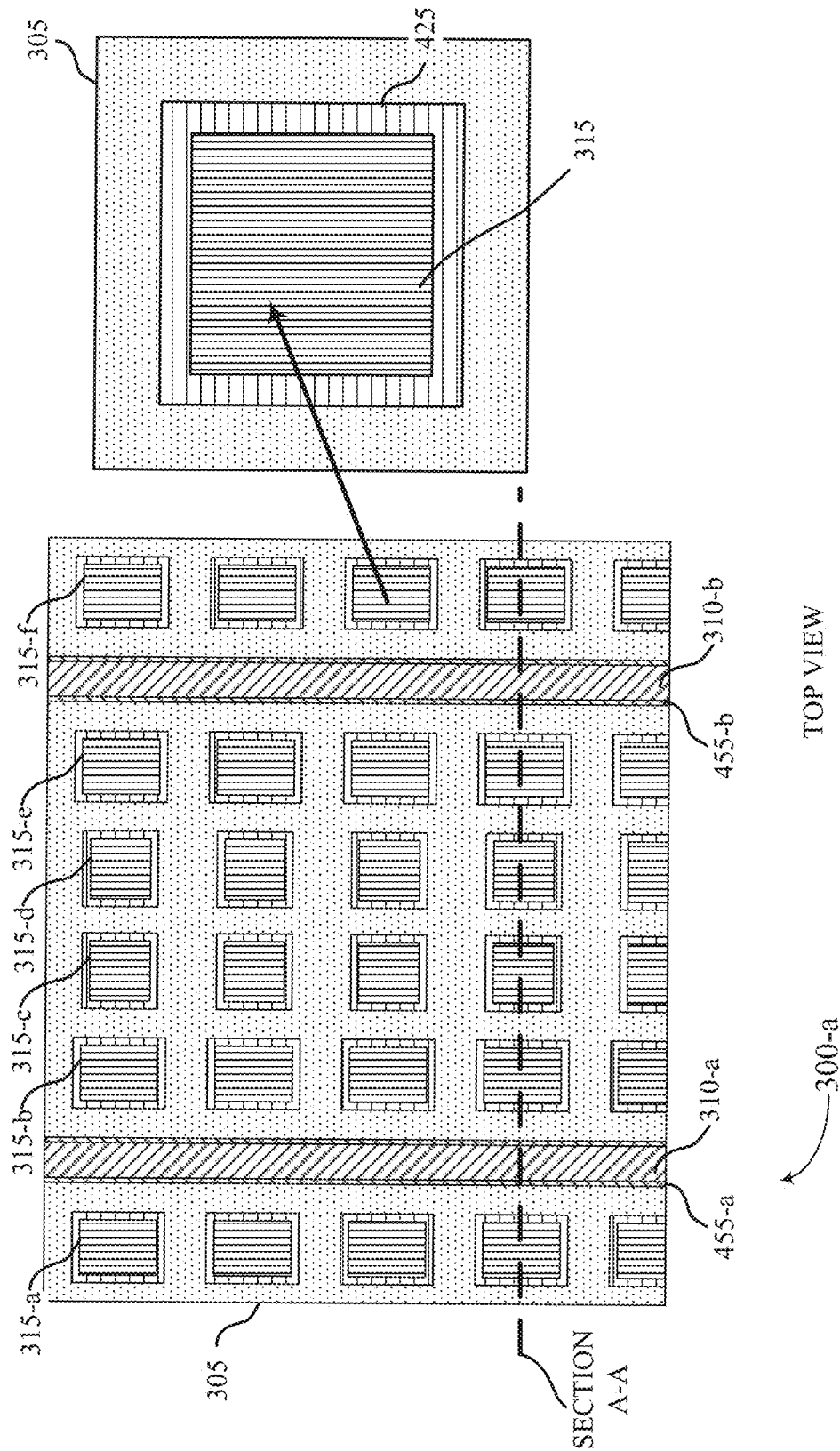
FIG. 3 illustrates an example of a memory architecture that supports divider and contact formation for memory cells in accordance with examples as disclosed herein.

FIG. 3 illustrates a top plan view of an example of a material arrangement 300-a after performing one or more manufacturing operations as described herein. FIG. 3 includes a cross-section line "SECTION A-A" which may be associated with a cross-section in an xy-plane through a portion of the material arrangement 300-a from which subsequent Figures may be viewed.

The material arrangement 300-a may illustrate a resulting structure after various processing steps are performed to form one or more dividers 310 and one or more contacts 315 within one or more layers of material 305. For example, as described with reference to FIGS. 4 through 12, various etching, disposition, and other operations may be performed such that the resulting structure includes one or more dividers 310 that each include respective caps 455 and one or more contacts 315 that each include respective caps 425. In some examples, the layers of material 305 may be deposited in contact with (e.g., above) a substrate and may include various interconnections or routing circuitry (e.g., access lines, power routing lines), control circuitry (e.g., transistors, logic, decoder circuitry, aspects of a memory controller 180, a column decoder 150, a row decoder 160, a sense component 170, an input/output component 190), among other circuitry, which may include various conductor, semiconductor, or dielectric materials between the layer of material 305 and the substrate. In some examples, the substrate itself may include such interconnection or routing circuitry.

As described herein, various manufacturing operations may be performed to prevent or mitigate undercutting when fabricating the dividers 310 and contacts 315 using wet etching operations. For example, a dry etching operation may first be performed to expose an upper surface of the contacts 315. Other materials—such as various oxide layers—may protect the dividers 310 such that, when sacrificial material is etched from the contacts 315 using a wet etching operation, material is not inadvertently removed from the dividers 310. Similarly, during subsequent processing operations, a dry etching operation may first be performed to expose an upper surface of the dividers 310 while other materials (e.g., oxide materials) protect the contacts 315. Accordingly, a wet etching operation may be performed to remove the sacrificial material from the dividers 310 while the contacts 315 are protected from potential undercutting.

As described herein, the contacts 315 of the material arrangement 300 may be etched and filled before the dividers 310 are etched and filled. However, in some examples, the processing operations may be performed in a different order such that the dividers 310 are etched and filled before the contacts 315 are etched and filled. In either example, undercutting may be prevented or mitigated, which may preserve some structures of the circuit while other structures are formed. Accordingly, such methods and structures may mitigate poor tolerances or performance that would otherwise occur due to the occurrence of undercutting.

Figure 4:
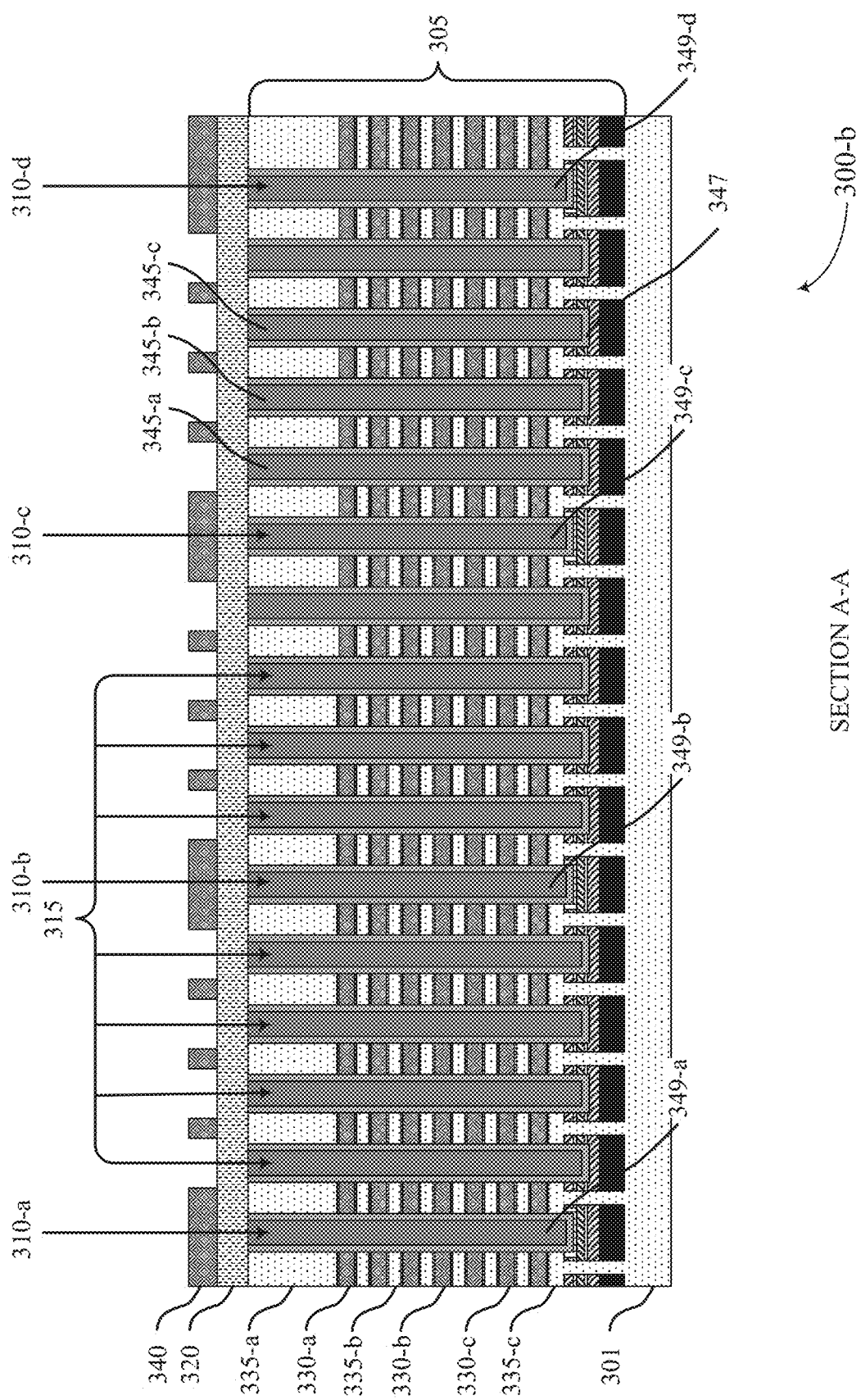
FIGS. 4 through 12 illustrate examples of manufacturing operations that support divider and contact formation for memory cells in accordance with examples as disclosed herein.

FIG. 4 illustrates an example of a material arrangement 300-b and may illustrate a first set of processing steps for forming a plurality of contacts and a plurality of dividers above a substrate. As described herein, FIG. 4 may illustrate the manufacturing operations from a cross-sectional side view (e.g., relative to the cut plane A-A) as described with reference to FIG. 3.

In some examples, during prior manufacturing operations, one or more layers of material 305 may be deposited over a substrate 301, where a lower surface of the layers of material 305 are coplanar with an upper surface of substrate 301. Layers of material 305 may include semiconductor materials (e.g., materials intermediate in electrical conductivity between a conductor and an insulator), insulative materials (e.g., a material that creates barrier of passage of electrical current), conductive materials (e.g., a material that allows the passage of electrical current), or dielectric materials (e.g., an electrical insulator that can be polarized by an applied electric field). In some examples, the layers of material 305 may include alternating layers of material 330 (e.g., 330-a, 330-b, 330-c, etc.) and material 335 (e.g., 335-a, 335-b, etc.). For example, the material 330 may be a nitride material (e.g., a tier nitride) and the material 335 may be a dielectric material or an oxide material. Additionally or alternatively, the material 330, the material 335, or both may be sacrificial materials.

In some examples, the layers of material 305 may also include one or more dividers 310 (e.g., slits) and one or more contacts 315. The and contacts 315 may extend in a first direction (e.g., in a y-direction) and may be filled with a material 345 (e.g., a first polysilicon material) and a liner 347. Similarly, the dividers 310 may extend in the first direction (e.g., in the y-direction) and may be filled with a material 349 (e.g., a second polysilicon material, which may be a same or a different material than the first polysilicon material). As an illustrative example, the polysilicon materials 345 and 349 may be sacrificial materials that are patterned and removed in later processing operations and may be selected based on one or more properties, such as its hardness (e.g., its ability to be etched using a specific etchant). Additionally or alternatively, the liner 347 may be an oxide or a nitride material and may or may not be a sacrificial material.

The first set of processing operations as described with reference to FIG. 4 may include forming a first oxide layer 320 over the layers of material 305. For example, the first oxide layer 320 may be formed of a material, such as tetraethyl orthosilicate (TEOS), and may be coplanar with an upper surface of the layers of material 305. In some examples, the first oxide layer 320 may be formed for a first duration, thus resulting in a thickness of greater than or equal to approximately 1000 angstroms (e.g., greater than or equal to 100 A).

The first set of processing operations may also include depositing a photoresist layer 340 over the first oxide layer 320. In some examples, an upper surface of the first oxide layer 320 may be coplanar with (e.g., in contact with) a lower surface of photoresist layer 340. For example, the photoresist layer 340 may be selectively deposited above the layer of materials 305 such that an upper surface of the first oxide layer 320 above the contacts 315 is exposed. Alternatively, as described below, the photoresist layer 340 may be deposited above the first oxide layer 320 and may be selectively etched to expose the upper surface of the first oxide layer 320 above the contacts 315.

A photoresist layer 340 may be formed of a light-sensitive and may support subsequent processing operations (e.g., photolithography, photoengraving, dry etch, etc.). The photoresist layer 340 may be an example of a positive or negative photoresist (e.g., a positive photoresist may decompose in the developer solution when exposed to light, or become insoluble to the developer solution when exposed to light).

In some examples, the first set of manufacturing operations may include etching the photoresist layer 340 (e.g., using a dry etch procedure) to remove portions above the layers of material 305 when the photoresist layer is deposited over the first oxide layer 320 (e.g., when the photoresist layer is not selectively deposited). A dry etch may refer to removal of material by exposing the material to a bombardment of ions (such as a plasma of reactive gases such as fluorocarbons, oxygen, chlorine, boron trichloride; sometimes with addition of nitrogen, argon, helium and other gases). A dry etching operation may etch one or more materials directionally or anisotropically.

For example, using an etching operation, the portions of the photoresist layer 340 may be removed above the contacts 315, thus exposing an upper surface (e.g., a top surface) of the oxide layer 320. Portions of the photoresist layer 340 may not be etched during the etching operation. For example, portions of the photoresist layer 340 may remain above the dividers 310 (and the oxide layer 320), which may protect the dividers 310 during subsequent manufacturing operations.

Figure 5:
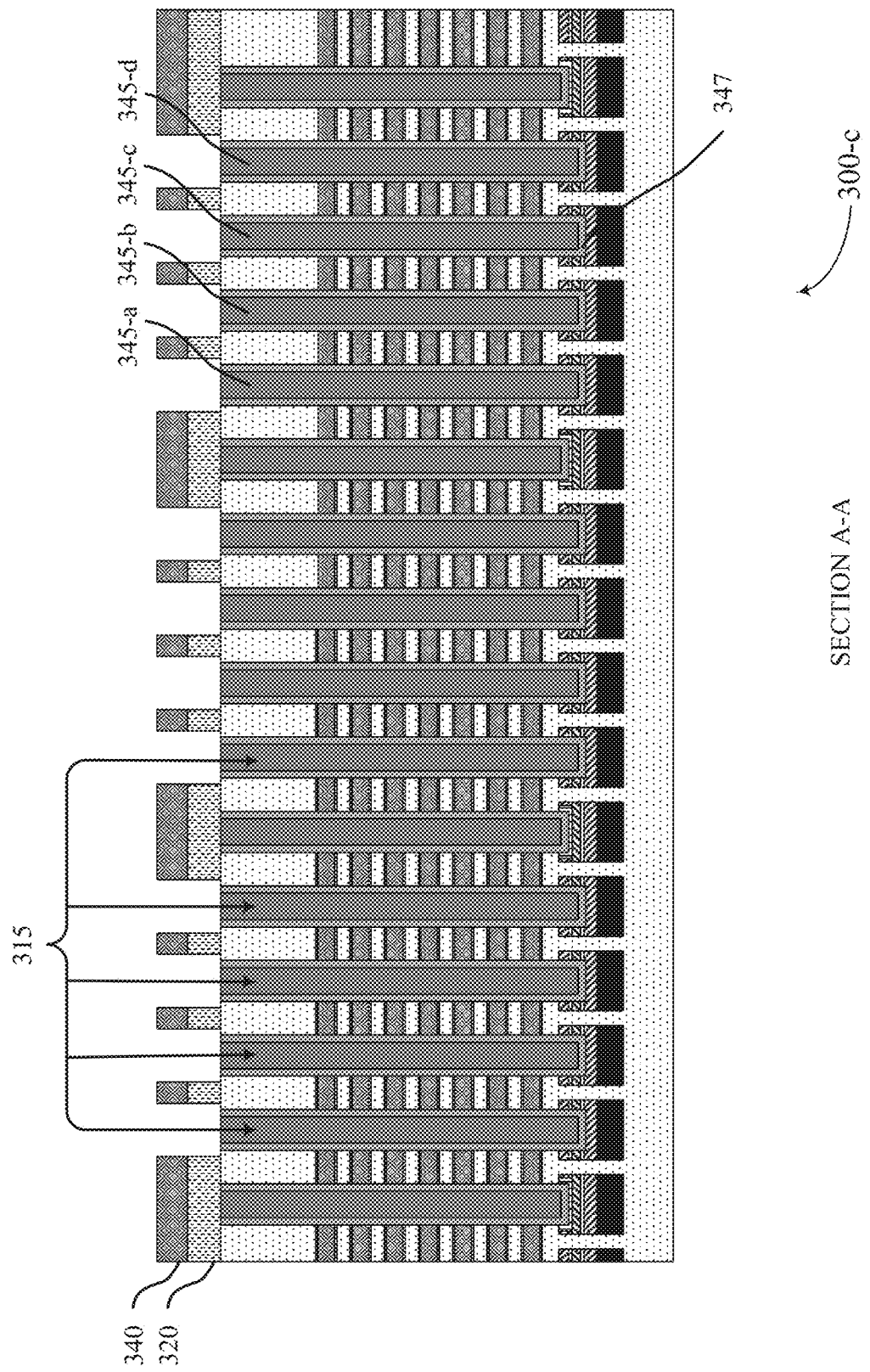

FIG. 5 illustrates an example of a material arrangement 300-c and may illustrate a second set of processing steps for forming a plurality of contacts and a plurality of dividers above a substrate. As described herein, FIG. 5 may illustrate the manufacturing operations from a cross-sectional side view (e.g., relative to the cut plane A-A) as described with reference to FIG. 3.

In some cases, the second set of processing steps may include etching the oxide layer 320 (e.g., using a dry etch procedure) to remove portions above the layers of material 305. For example, using an etching operation, the portions of the oxide layer 320 may be removed above the contacts 315, thus exposing an upper surface (e.g., a top surface) of the contacts 315. Specifically, the etching operation may expose an upper surface of the sacrificial material 345. Portions of the oxide layer 320 may not be etched during the etching operation. For example, portions of the oxide layer 320 may remain above the dividers 310 to protect the dividers 310 during subsequent manufacturing operations.

Figure 6:
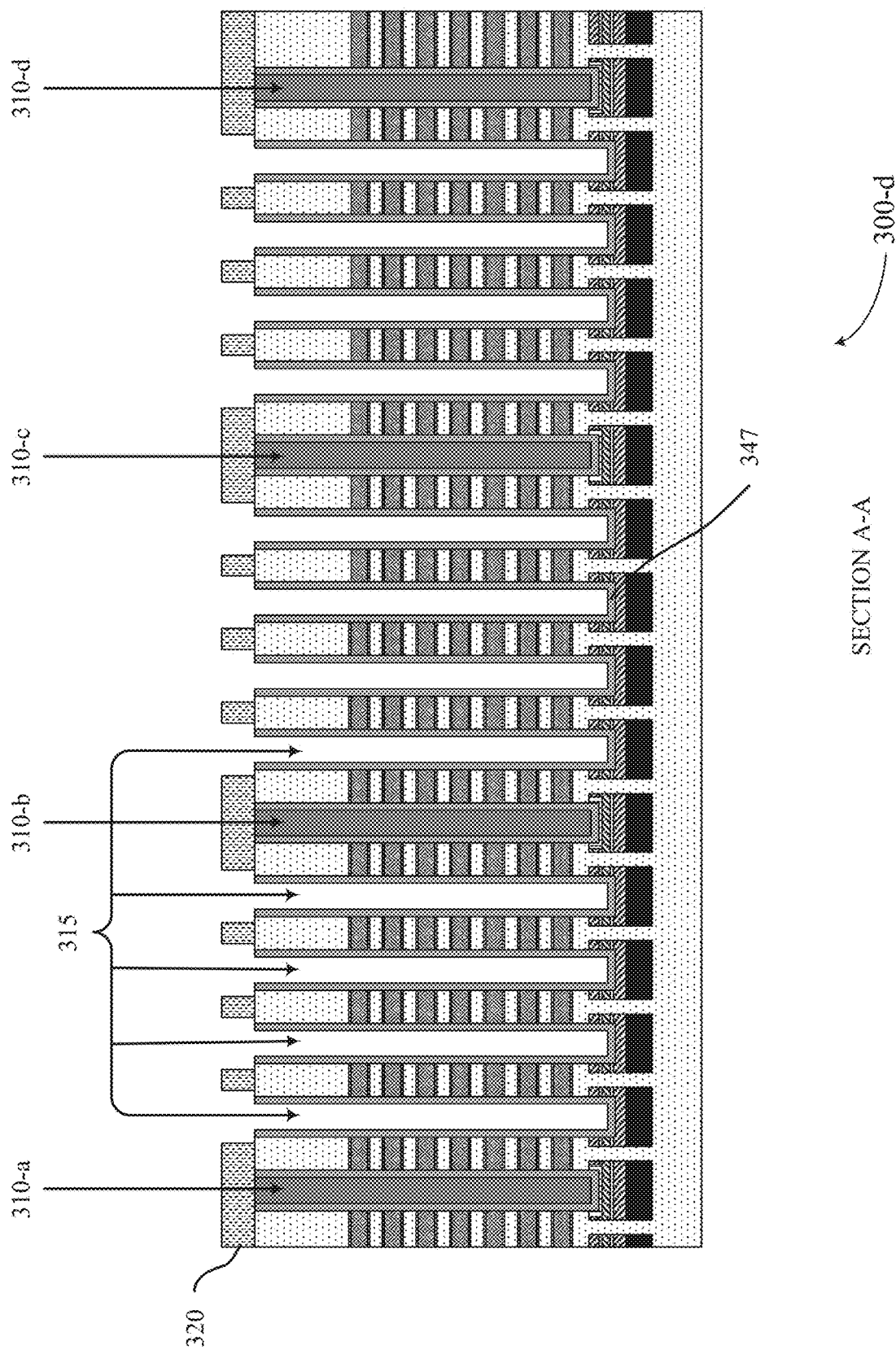

FIG. 6 illustrates an example of a material arrangement 300-d and may illustrate a third set of processing steps for forming a plurality of contacts and a plurality of dividers above a substrate. As described herein, FIG. 6 may illustrate the manufacturing operations from a cross-sectional side view (e.g., relative to the cut plane A-A) as described with reference to FIG. 3.

In some cases, the third set of processing steps may include an etching operation (e.g., a wet etching operation) to remove the sacrificial material 345 from the contacts 315 (e.g., a portion of material 345 within contacts 315). As described herein, the sacrificial material 345 may be a polysilicon material and may be referred to as a first polysilicon material 345. For example, the wet etching operation may remove the sacrificial material 345, thus exposing the liner 347 in each of the contacts 315. In some examples, the presence of the first oxide layer 320 atop the slits 310 may prevent the slits from being inadvertently etched during the wet etching operation. In other words, the material within each of the slits 310 may not be inadvertently etched during the processing steps illustrated in FIG. 6.

During the etching operation, the liner 347 may not be removed by the etchant due to the type of etchant used, the type of material the liner 347 comprises, or both. In some examples, one or more sidewalls of the liner 347 within each contact 315 may be exposed based on the etching operation. In some examples, the etching operation may also remove the remaining portions of the photoresist layer 340. A portion of the first oxide layer 320 may remain atop an upper surface of the layers of material 305 after the wet etching operation.

Figure 7:
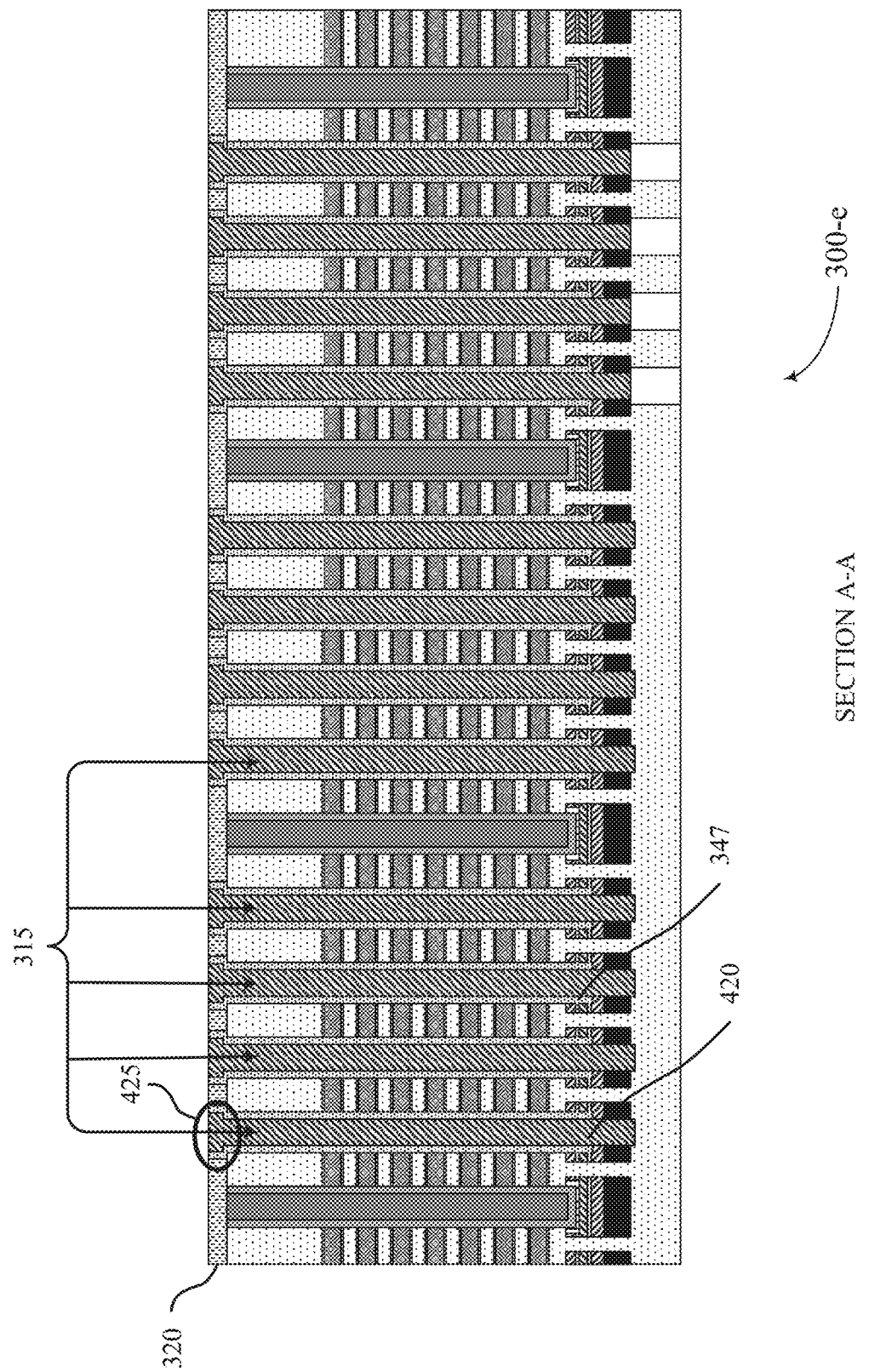

FIG. 7 illustrates an example of a material arrangement 300-e and may illustrate a fourth set of processing steps for forming a plurality of contacts and a plurality of dividers above a substrate. As described herein, FIG. 7 may illustrate the manufacturing operations from a cross-sectional side view (e.g., relative to the cut plane A-A) as described with reference to FIG. 3.

In some examples, the fourth set of processing operations may include the deposition of a material 420 within the contacts 315. In some examples, the material 420 may be a metal, a metal alloy, an electrically conductive ceramic such as tungsten silicide, an oxide, an oxide of silicon, a polysilicon material or another type of material. In some examples, the material 420 may be subsequently processed during the fabrication of one or more access lines, memory cells, or other components of a memory device (e.g., a memory device 100 as described with reference to FIG. 1). As described herein, a liner 347 may exist within each contact 315, thus the material 420 may be deposited such that it is in contact with one or more sidewalls of the liner 347. In other examples (not shown), the liner 347 may have been removed during the etching operation described with reference to FIG. 6. Accordingly, a second liner may be deposited before the material 420 is deposited within the contacts 315.

In some examples, an upper region 425 of each contact 315 may include at least one dimension different than the remaining portions of the contact 315. That is, because one or more sidewalls of the first oxide layer 320 may not be aligned with the sidewalls of the contact 315 in a vertical direction (e.g., in the y-direction), the material 420 may have a greater dimension in a horizontal direction (e.g., in the x-direction) in the upper region 425 of each contact 315. This feature may be referred to as a "cap" and each contact 315 may include a cap in its upper region 425. The upper region 425 may be wider than a lower region of the contact 315 based on the different etching operations used to form the contact. For example, the upper region 425 may be formed by a dry etch operation while the lower portions of the contact 315 may be removed with a wet etch operation that is subsequent to the dry etch operation. An upper surface of the upper region 425 may be coplanar with an upper surface of the first oxide layer 320. In some examples, these surfaces may be coplanar due to a planarization or polishing operation, such as a chemical-mechanical polishing (CMP) operation.

Figure 8:
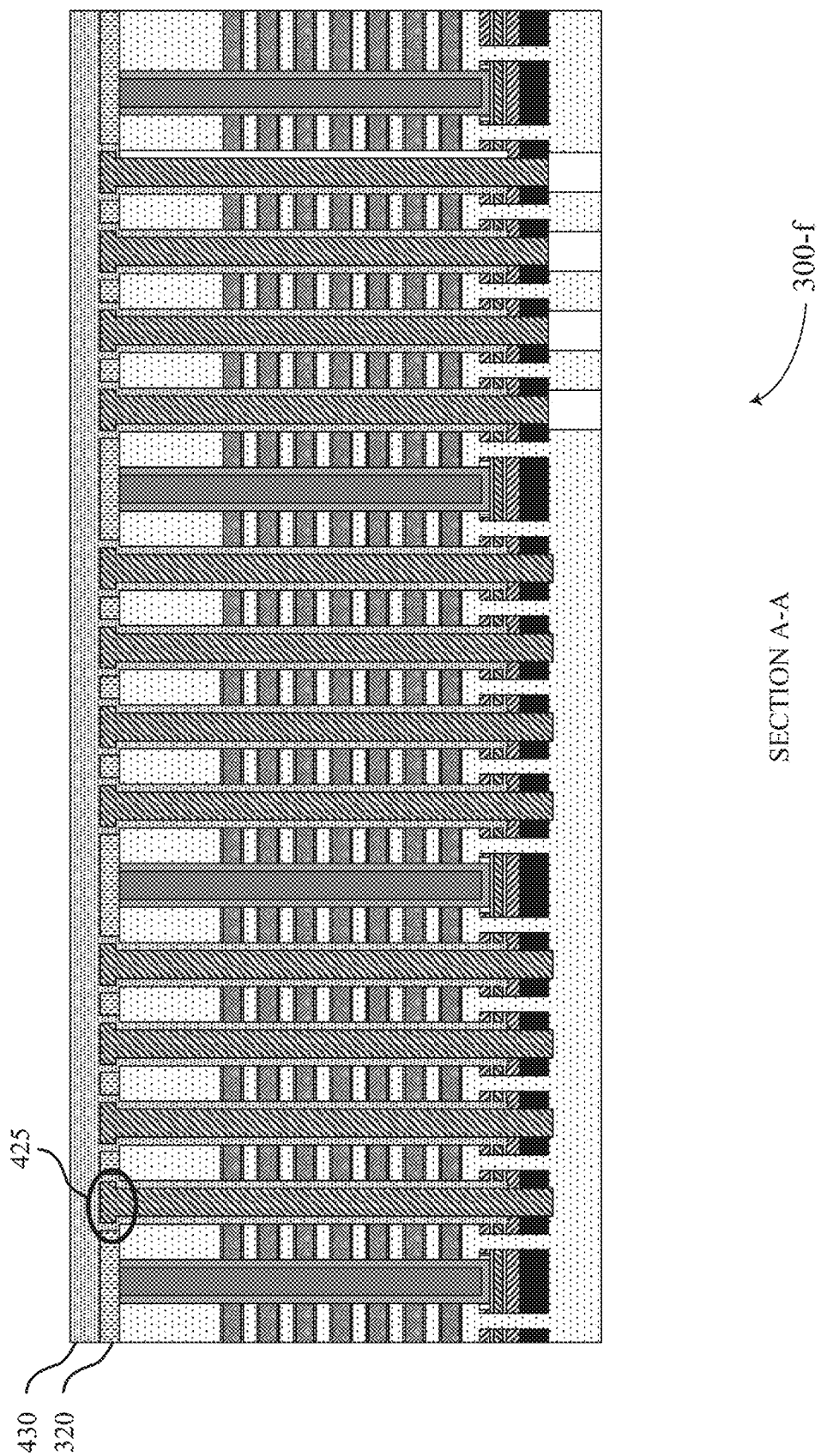

FIG. 8 illustrates an example of a material arrangement 300-f and may illustrate a fifth set of processing steps for forming a plurality of contacts and a plurality of dividers above a substrate. As described herein, FIG. 8 may illustrate the manufacturing operations from a cross-sectional side view (e.g., relative to the cut plane A-A) as described with reference to FIG. 3.

The fifth set of processing operations as described with reference to FIG. 8 may include forming a second oxide layer 430 over the first oxide layer 320. For example, the second oxide layer 430 may be formed of a material, such as tetraethyl orthosilicate (TEOS), or a different type of material, and may be coplanar with an upper surface of the upper region 425 of each contact 315 and an upper surface of the first oxide layer 320. In some examples, the first oxide layer 320 may be formed for a second duration, thus resulting in a greater thickness than the first oxide layer 320. For example, the second oxide layer 430 may have a thickness of between 1000 and 200 angstroms (e.g., between 1000 A and 2000 A).

Figure 9:
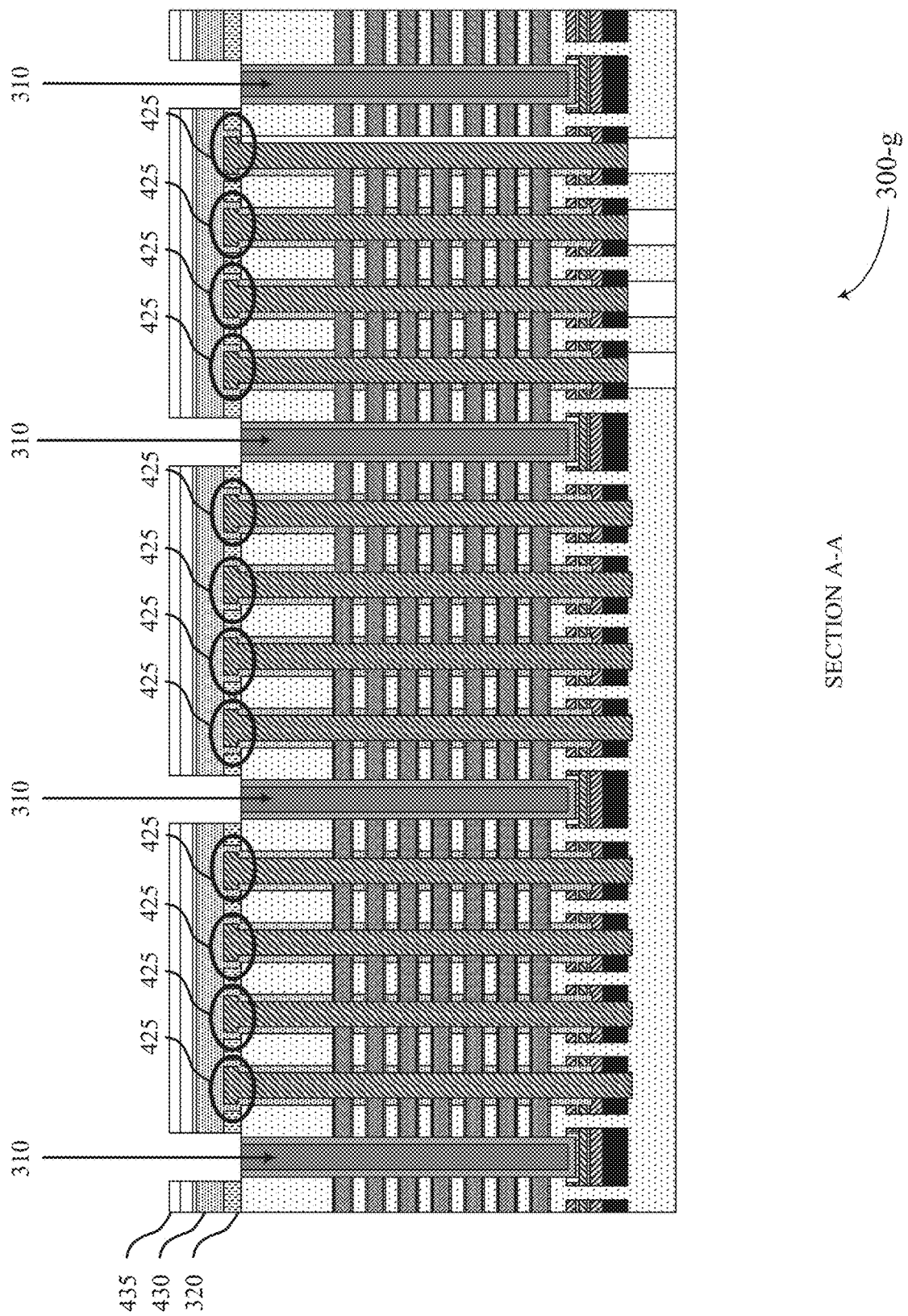

FIG. 9 illustrates an example of a material arrangement 300-g and may illustrate a sixth set of processing steps for forming a plurality of contacts and a plurality of dividers above a substrate. As described herein, FIG. 9 may illustrate the manufacturing operations from a cross-sectional side view (e.g., relative to the cut plane A-A) as described with reference to FIG. 3.

The sixth set of processing operations may also include depositing a second photoresist layer 435 over the second oxide layer 430. In some examples, an upper surface of the second oxide layer 430 may be coplanar with (e.g., in contact with) a lower surface of second photoresist layer 435. For example, the second photoresist layer 435 may be selectively deposited above the second oxide layer 430 such that an upper surface of the second oxide layer 320 above the dividers 310 is exposed. Alternatively, as described below, the second photoresist layer 435 may be deposited above the second oxide layer 430 and may be selectively etched to expose the upper surface of the second oxide layer 430 above the contacts 315.

In some examples, the sixth set of manufacturing operations may include etching the second photoresist layer 435, the second oxide layer 430, and the first oxide layer 320 (e.g., using a dry etch procedure) to expose an upper surface of each divider 310. For example, using an etching operation, the portions of the second photoresist layer 435, the second oxide layer 430, and the first oxide layer 320 may be removed above the dividers 310, thus exposing an upper surface (e.g., a top surface) of the sacrificial material within each divider 310. Portions of the second photoresist layer 435, the second oxide layer 430, and the first oxide layer 320 may not be etched during the etching operation. For example, portions of the second photoresist layer 435 and the second oxide layer 430 may remain above the contacts 315, and portions of the second photoresist layer 435, the second oxide layer 430, and the first oxide layer 320 remain above regions between each contact 315 (and between each contact 315 and each divider 310), which may protect the contacts 315 during subsequent manufacturing operations.

Figure 10:
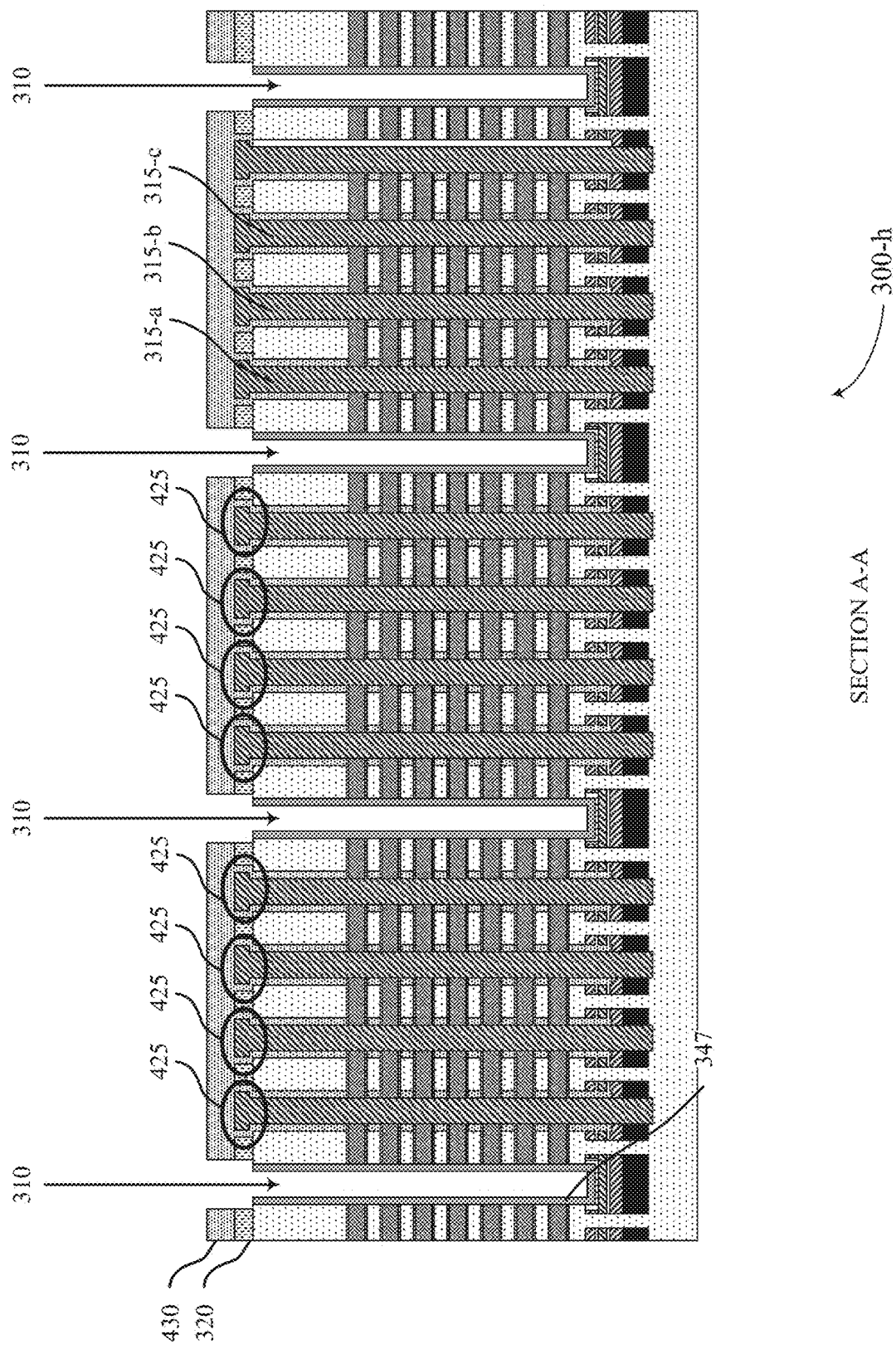

FIG. 10 illustrates an example of a material arrangement 300-h and may illustrate a seventh set of processing steps for forming a plurality of contacts and a plurality of dividers above a substrate. As described herein, FIG. 10 may illustrate the manufacturing operations from a cross-sectional side view (e.g., relative to the cut plane A-A) as described with reference to FIG. 3.

In some cases, the seventh set of processing steps may include an etching operation (e.g., a wet etching operation) to remove the sacrificial material from the dividers 310 (e.g., a portion of material within the dividers 310). For example, the wet etching operation may remove the sacrificial material, thus exposing the liner 347 in each of the dividers 310. In some examples, the presence of the second oxide layer 430 atop the contacts 315 may prevent the contacts 315 from being inadvertently etched during the wet etching operation. In other words, the material within each of the contacts 315 may not be inadvertently etched during the processing steps illustrated in FIG. 10.

During the etching operation, the liner 347 may not be removed by the etchant due to the type of etchant used, the type of material the liner 347 comprises, or both. In some examples, one or more sidewalls of the liner 347 within each divider 310 may be exposed based on the etching operation. In some examples, the etching operation may also remove the remaining portions of the second photoresist layer 435. A portion of the second oxide layer 430 may remain atop an upper surface of the first oxide layer 320 after the wet etching operation.

Figure 11:
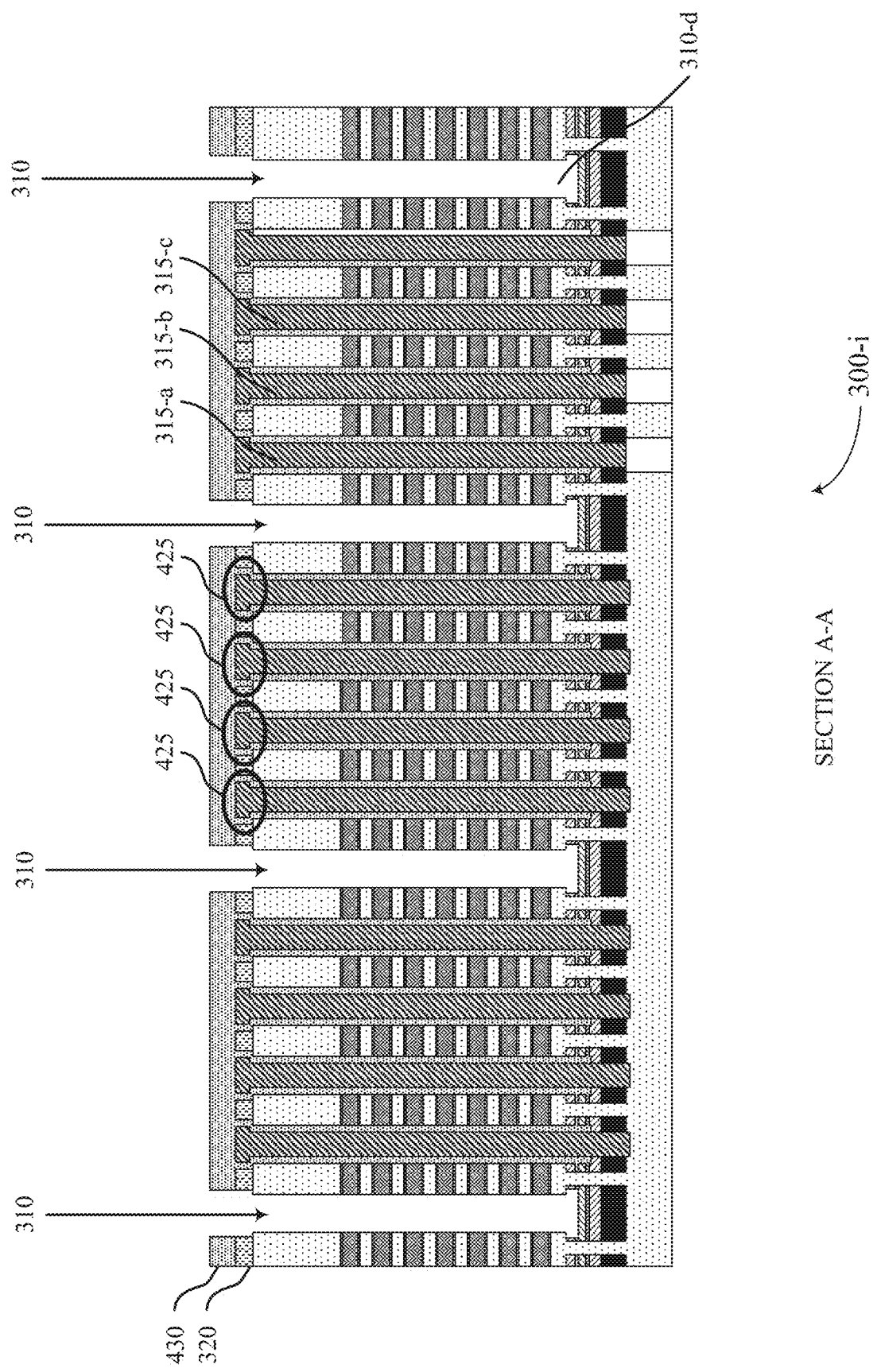

FIG. 11 illustrates an example of a material arrangement 300-i and may illustrate an eighth set of processing steps for forming a plurality of contacts and a plurality of dividers above a substrate. As described herein, FIG. 11 may illustrate the manufacturing operations from a cross-sectional side view (e.g., relative to the cut plane A-A) as described with reference to FIG. 3.

In some cases, the eighth set of processing steps may include an etching operation (e.g., a wet etching operation) to remove the liner 347 from the dividers 310. For example, the wet etching operation may remove the liner 347 from each dividers 310, thus resulting in each divider 310 being free from any material. In some examples, a different etchant may be used to remove the liners 347 from the dividers than was used to remove the sacrificial materials from the dividers 310 or the contacts 315. Additionally or alternatively, the presence of the second oxide layer 430 atop the contacts 315 may prevent the contacts 315 from being inadvertently etched during the wet etching operation. In other words, the material within each of the contacts 315 may not be inadvertently etched during the processing steps illustrated in FIG. 11.

Figure 12:
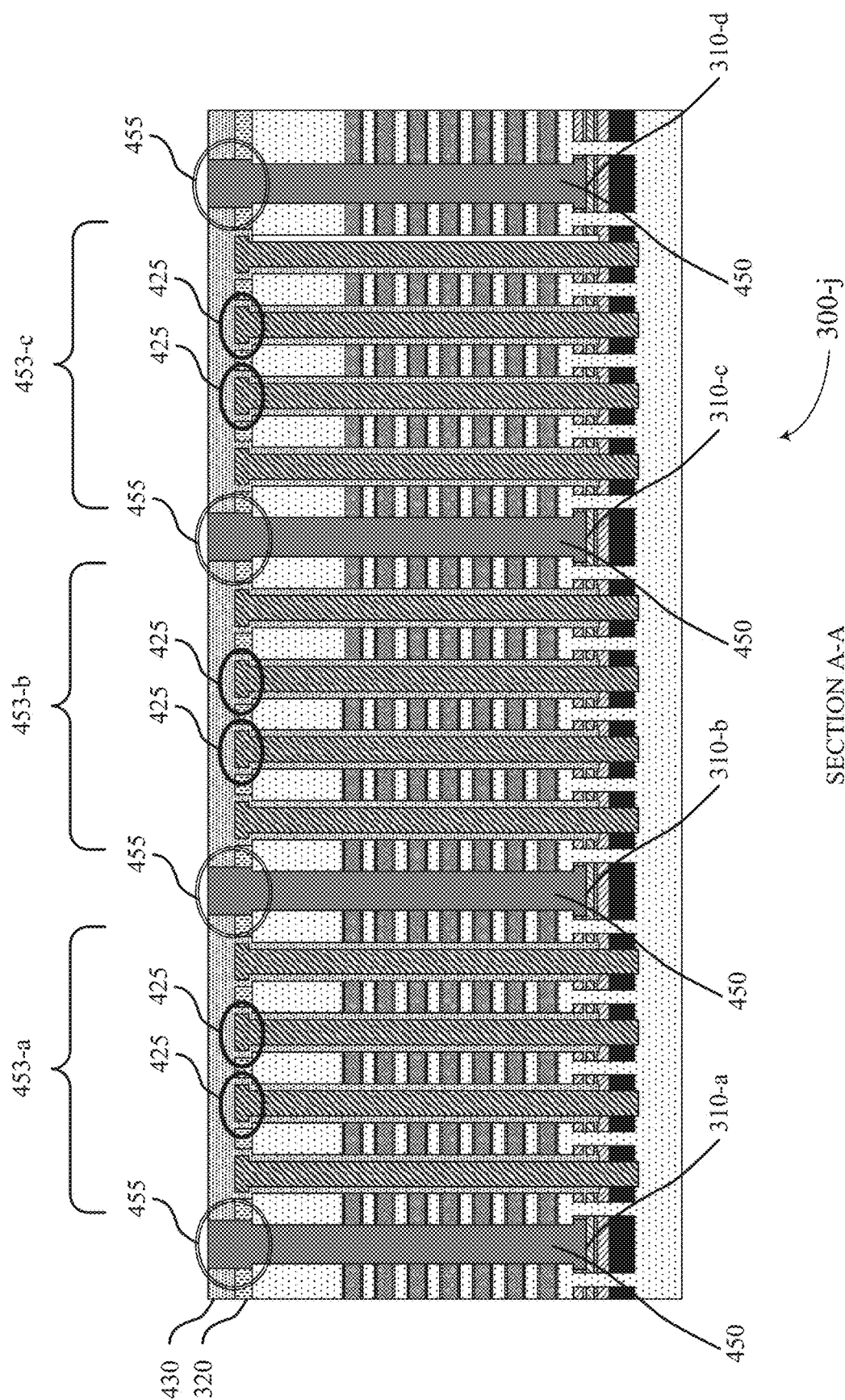

FIG. 12 illustrates an example of a material arrangement 300-*j* and may illustrate a ninth set of processing steps for forming a plurality of contacts and a plurality of dividers above a substrate. As described herein, FIG. 12 may illustrate the manufacturing operations from a cross-sectional side view (e.g., relative to the cut plane A-A) as described with reference to FIG. 3.

In some examples, the ninth set of processing operations may include the deposition of a material 450 within the dividers 310. In some examples, the material 450 may be an insulative material and may insulate (e.g., isolate) one or more regions 453 from another. As used herein, a "region" 453 may refer to an area between two consecutive dividers 310. For example, the region 453-*a* may refer to the area between the divider 310-*a* and the divider 310-*b* and may include one or more contacts 315. Subsequent processing operations may be performed on a region 453 such that the region 453 may be associated with a bank of memory cells.

In some examples, an upper region 455 of each divider 310 may include at least one dimension different than the remaining portions of the divider 310. That is, because one or more sidewalls of the first oxide layer 320 and the second oxide layer 430 may not be aligned with the sidewalls of the divider 310 in a vertical direction (e.g., in the y-direction), the material 450 may have a greater dimension in a horizontal direction (e.g., in the x-direction) in the upper region 455 of each divider 310. This feature may be referred to as a "cap" and each divider 310 may include a cap in its upper region 455.

An upper surface of the upper region 455 may thus be coplanar with an upper surface of the second oxide layer 430. In some examples, these surfaces may be coplanar due to a planarization or polishing operation, such as a chemical-mechanical polishing (CMP) operation. Additionally or alternatively, a dimension of the upper region 455 of each divider 310 may be different (e.g., greater) than a corresponding dimension of an upper region 425 of the contacts 315. For example, a dimension of the upper region 455 of each divider 310 may be greater in a vertical direction (e.g., in a y-direction) due to the thickness of the of the first oxide layer 320 and the second oxide layer 430. By performing the processing steps as described herein with reference to FIGS. 3 through 12 to manufacture a memory structure, undercutting may be prevented or mitigated, which may preserve some structures of the circuit while other structures are formed. Accordingly, such methods may mitigate poor tolerances or performance that would otherwise occur due to the occurrence of undercutting.

Figure 13:
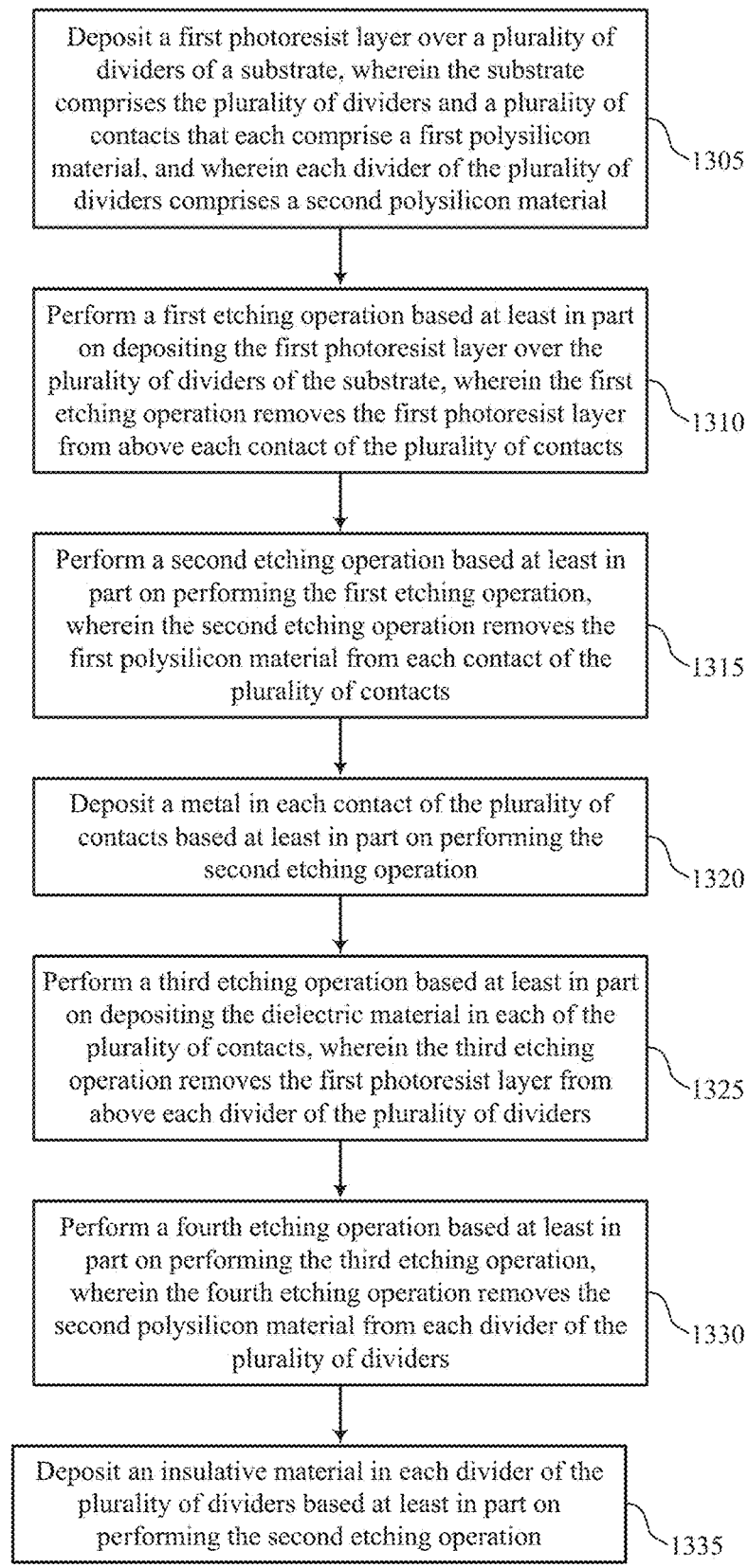
FIG. 13 shows a flowchart illustrating a method that supports divider and contact formation for memory cells in accordance with examples as disclosed herein.

FIG. 13 shows a flowchart illustrating a method 1300 that supports divider and contact formation for memory cells in accordance with examples as disclosed herein. The operations of method 1300 may be implemented by a manufacturing device or its components as described herein. For example, the operations of method 1300 may be performed by a manufacturing device as described with reference to FIGS. 1 through 12. In some examples, a manufacturing device may execute a set of instructions to control the functional elements of the device to perform the described functions. Additionally, or alternatively, the manufacturing device may perform aspects of the described functions using special-purpose hardware.

At 1305, the method may include depositing a first photoresist layer over a plurality of dividers of a substrate, where the substrate includes the plurality of dividers and a plurality of contacts that each include a first polysilicon material, and where each divider of the plurality of dividers includes a second polysilicon material. The operations of 1305 may be performed in accordance with examples as disclosed herein.

At 1310, the method may include performing a first etching operation based at least in part on depositing the first photoresist layer over the plurality of dividers of the substrate, where the first etching operation removes the first photoresist layer from above each contact of the plurality of contacts. The operations of 1310 may be performed in accordance with examples as disclosed herein.

At 1315, the method may include performing a second etching operation based at least in part on performing the first etching operation, where the second etching operation removes the first polysilicon material from each contact of the plurality of contacts. The operations of 1315 may be performed in accordance with examples as disclosed herein.

At 1320, the method may include depositing a metal in each contact of the plurality of contacts based at least in part on performing the second etching operation. The operations of 1320 may be performed in accordance with examples as disclosed herein.

At 1325, the method may include performing a third etching operation based at least in part on depositing the dielectric material in each of the plurality of contacts, where the third etching operation removes the first photoresist layer from above each divider of the plurality of dividers. The operations of 1325 may be performed in accordance with examples as disclosed herein.

At 1330, the method may include performing a fourth etching operation based at least in part on performing the third etching operation, where the fourth etching operation removes the second polysilicon material from each divider of the plurality of dividers. The operations of 1330 may be performed in accordance with examples as disclosed herein.

At 1335, the method may include depositing an insulative material in each divider of the plurality of dividers based at least in part on performing the second etching operation. The operations of 1335 may be performed in accordance with examples as disclosed herein.

In some examples, an apparatus as described herein may perform a method or methods, such as the method 1300. The apparatus may include features, circuitry, logic, means, or instructions (e.g., a non-transitory computer-readable medium storing instructions executable by a processor), or any combination thereof for performing the following aspects of the present disclosure:

A method is described. In some examples, the method may include depositing a first photoresist layer over a plurality of dividers of a substrate, wherein the substrate comprises the plurality of dividers and a plurality of contacts that each comprise a first polysilicon material, and wherein each divider of the plurality of dividers comprises a second polysilicon material, performing a first etching operation based at least in part on depositing the first photoresist layer over the plurality of dividers of the substrate, wherein the first etching operation removes the first photoresist layer from above each contact of the plurality of contacts, performing a second etching operation based at least in part on performing the first etching operation, wherein the second etching operation removes the first polysilicon material from each contact of the plurality of contacts, depositing a metal in each contact of the plurality of contacts based at least in part on performing the second etching operation, performing a third etching operation based at least in part on depositing the dielectric material in each of the plurality of contacts, wherein the third etching operation removes the first photoresist layer from above each divider of the plurality of dividers, performing a fourth etching operation based at least in part on performing the third etching operation, wherein the fourth etching operation removes the second polysilicon material from each divider of the plurality of dividers, and depositing an insulative material in each divider of the plurality of dividers based at least in part on performing the second etching operation.

In some examples, the method may include forming a first oxide layer over the plurality of dividers and the plurality of contacts of the substrate, wherein the first photoresist layer is deposited over the first oxide layer.

In some examples, the method may include performing a fifth etching operation based at least in part on forming the first oxide layer over the plurality of dividers and the plurality of contacts of the substrate, wherein the fifth etching operation removes the first oxide layer above each contact of the plurality of contacts.

In some examples, the third etching operation removes the first oxide layer above each divider of the plurality of dividers, and wherein an upper surface of the dielectric material in each contact of the plurality of contacts is coplanar with an upper surface of the first oxide layer after performing the third etching operation.

In some examples, the method may include forming a second oxide layer above the first oxide layer after depositing the insulative material in each divider of the plurality of dividers, wherein the second oxide layer is in contact with one or more portions of the first oxide layer and the dielectric material in each contact of the plurality of contacts.

In some examples, an upper surface of the insulative material is coplanar with an upper surface of the second oxide layer.

In some examples, the method may include forming a second oxide layer over the plurality of contacts and the plurality of dividers after depositing the metal in each contact of the plurality of contacts, depositing a second photoresist layer over the second oxide layer, and performing a sixth etching operation based at least in part on depositing the second photoresist layer, wherein the sixth etching operation removes the second oxide layer and the second photoresist layer above each divider of the plurality of dividers.

In some examples, each divider of the plurality of dividers may include a nitride liner and the second polysilicon material, and the method may include performing a seventh etching operation based at least in part on performing the fourth etching operation, wherein depositing the insulative material in each divider of the plurality of dividers is based at least in part on performing the seventh etching operation.

In some examples, the first etching operation and the third etching operation are performed using a dry etching operation.

In some examples, the second etching operation and the fourth etching operation are performed using a wet etching operation.

It should be noted that the described methods include possible implementations, and that the operations and the steps may be rearranged or otherwise modified and that other implementations are possible. Further, portions from two or more of the methods may be combined.

In some examples, an apparatus as described herein may perform a method or methods, such as the method 1300. The apparatus may include features, circuitry, logic, means, or instructions (e.g., a non-transitory computer-readable medium storing instructions executable by a processor), or any combination thereof for performing the following aspects of the present disclosure:

Aspect 1: An apparatus, including: a plurality of access lines extending in a first direction; a plurality of contacts extending in a second direction, where each contact of the plurality of contacts includes a first region and a second region, where the first region includes at least a first sidewall, a second sidewall, and an upper surface, where the second region includes at least a third sidewall and a fourth sidewall, and where a distance between the first sidewall and the second sidewall is greater than a distance between the third sidewall and the fourth sidewall; a plurality of dividers extending in the second direction, where each divider of the plurality of dividers includes a third region and a fourth region, where the third region includes at least a fifth sidewall, a sixth sidewall, and an upper surface, where the second region includes at least a seventh sidewall and an eight sidewall, and where a distance between the fifth sidewall and the sixth sidewall is greater than a distance between the seventh sidewall and the eight sidewall; a first oxide layer located above the upper surface of the first region of each contact of the plurality of contacts, where an upper surface of the first oxide layer is coplanar with the upper surface of the third region of each divider of the plurality of dividers; and a second oxide layer located below the first oxide layer, where respective portions of the second oxide layer are located between respective first regions of each contact of the plurality of contacts.

Aspect 2: The apparatus of aspect 1, where the second oxide layer is in contact with the first sidewall and the second sidewall of the first region of adjacent contacts.

Aspect 3: The apparatus of any of aspects 1 through 2, where an area of the third region of the plurality of dividers is greater than an area of the first region of the plurality of contacts.

Aspect 4: The apparatus of any of aspects 1 through 3, where the third region of the plurality of dividers extends above the first region of the plurality of contacts in a vertical direction.

Aspect 5: The apparatus of any of aspects 1 through 4, where an upper surface of each of the respective portions of the second oxide layer are coplanar with the upper surface of the first region of each contact of the plurality of contacts.

Aspect 6: The apparatus of any of aspects 1 through 5, where each contact of the plurality of contacts includes a dielectric material and each divider of the plurality of dividers includes an insulative material.

Aspect 7: The apparatus of any of aspects 1 through 6, where each contact of the plurality of contacts includes a metal configured as a second access line.

Aspect 8: The apparatus of any of aspects 1 through 7, where each contact of the plurality of contacts includes a nitride liner.

Aspect 9: The apparatus of any of aspects 1 through 8, where a first subset of the plurality of contacts is included in an area located between a first divider and a second divider of the plurality of dividers, and the area located between the first divider and the second divider of the plurality of dividers is associated with a first bank of memory cells.

An apparatus is described. The following provides an overview of aspects of the apparatus as described herein:

Aspect 10: An apparatus, including: a plurality of access lines extending in a first direction; a plurality of contacts extending in a second direction, where each contact of the plurality of contacts includes a first region and a second region, where the first region includes a different dimension than the second region in at least one direction; a plurality of dividers extending in the second direction, where each divider of the plurality of dividers includes a third region and a fourth region, where the third region includes a different dimension than the fourth region in at least one direction; a first oxide layer located above the first region of each contact of the plurality of contacts, where an upper surface of the first oxide layer is coplanar with an upper surface of the third region of each divider of the plurality of dividers; and a second oxide layer located below the first oxide layer, where respective portions of the second oxide layer are located between respective first regions of each contact of the plurality of contacts.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. A method, comprising:
depositing a first photoresist layer over a plurality of dividers of a substrate, wherein the substrate comprises the plurality of dividers and a plurality of contacts that each comprise a first polysilicon material, and wherein each divider of the plurality of dividers comprises a second polysilicon material;

performing a first etching operation based at least in part on depositing the first photoresist layer over the plurality of dividers of the substrate, wherein the first etching operation removes the first photoresist layer from above each contact of the plurality of contacts;

performing a second etching operation based at least in part on performing the first etching operation, wherein the second etching operation removes the first polysilicon material from each contact of the plurality of contacts;

performing a third etching operation based at least in part on performing the second etching operation, wherein the third etching operation removes the first photoresist layer from above each divider of the plurality of dividers;

depositing a metal in each contact of the plurality of contacts based at least in part on performing the second etching operation;

performing a fourth etching operation based at least in part on performing the third etching operation, wherein the fourth etching operation removes the second polysilicon material from each divider of the plurality of dividers; and depositing an insulative material in each divider of the plurality of dividers based at least in part on performing the fourth etching operation.

2. The method of claim 1, further comprising:
forming a first oxide layer over the plurality of dividers and the plurality of contacts of the substrate, wherein the first photoresist layer is deposited over the first oxide layer.

3. The method of claim 2, further comprising:
performing a fifth etching operation based at least in part on forming the first oxide layer over the plurality of dividers and the plurality of contacts of the substrate and based at least in part on performing the first etching operation to remove the first photoresist layer from above each contact of the plurality of contacts, wherein the fifth etching operation removes the first oxide layer above each contact of the plurality of contacts.

4. The method of claim 2, wherein:
the third etching operation removes the first oxide layer above each divider of the plurality of dividers, and
an upper surface of the metal in each contact of the plurality of contacts is coplanar with an upper surface of the first oxide layer after performing the third etching operation.

5. The method of claim 2, further comprising:
forming a second oxide layer above the first oxide layer after depositing the insulative material in each divider of the plurality of dividers, wherein the second oxide layer is in contact with one or more portions of the first oxide layer and the metal in each contact of the plurality of contacts.

6. The method of claim 5, wherein an upper surface of the insulative material is coplanar with an upper surface of the second oxide layer.

7. The method of claim 1, further comprising:
forming a second oxide layer over the plurality of contacts and the plurality of dividers after depositing the metal in each contact of the plurality of contacts;
depositing a second photoresist layer over the second oxide layer; and
performing a sixth etching operation based at least in part on depositing the second photoresist layer, wherein the sixth etching operation removes the second oxide layer and the second photoresist layer above each divider of the plurality of dividers.

8. The method of claim 1, wherein each divider of the plurality of dividers comprises a nitride liner and the second polysilicon material, the method further comprising:
performing a seventh etching operation based at least in part on performing the fourth etching operation, wherein depositing the insulative material in each divider of the plurality of dividers is based at least in part on performing the seventh etching operation.

9. The method of claim 1, wherein the first etching operation and the third etching operation are performed using a dry etching operation.

10. The method of claim 1, wherein the second etching operation and the fourth etching operation are performed using a wet etching operation.

* * * * *